US009847792B2

(12) United States Patent
Miyadera et al.

(10) Patent No.: US 9,847,792 B2
(45) Date of Patent: Dec. 19, 2017

(54) COMMUNICATION APPARATUS, IMAGE FORMING APPARATUS, COMMUNICATION METHOD, AND COMPUTER-READABLE STORAGE MEDIUM

(71) Applicants: Tatsuya Miyadera, Kanagawa (JP); Satoshi Ohmiya, Kanagawa (JP); Tatsuo Ohyama, Kanagawa (JP); Masahiko Oikawa, Kanagawa (JP); Yuichiro Shukuya, Kanagawa (JP); Makoto Higashiyama, Kanagawa (JP); Yasuhiro Abe, Kanagawa (JP)

(72) Inventors: Tatsuya Miyadera, Kanagawa (JP); Satoshi Ohmiya, Kanagawa (JP); Tatsuo Ohyama, Kanagawa (JP); Masahiko Oikawa, Kanagawa (JP); Yuichiro Shukuya, Kanagawa (JP); Makoto Higashiyama, Kanagawa (JP); Yasuhiro Abe, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/993,655

(22) Filed: Jan. 12, 2016

(65) Prior Publication Data
US 2016/0126977 A1      May 5, 2016

Related U.S. Application Data

(63) Continuation of application No. 14/600,339, filed on Jan. 20, 2015, now Pat. No. 9,397,697.

(30) Foreign Application Priority Data

Feb. 3, 2014   (JP) ................................. 2014-018728

(51) Int. Cl.
H03M 9/00        (2006.01)
H03M 7/40        (2006.01)
(Continued)

(52) U.S. Cl.
CPC .............. *H03M 9/00* (2013.01); *G03G 15/50* (2013.01); *H03M 5/145* (2013.01); *H03M 7/4093* (2013.01)

(58) Field of Classification Search
CPC ................... H04N 1/506; H04N 1/047; H04N 2201/04768; H03K 5/1504
See application file for complete search history.

(56) References Cited

U.S. PATENT DOCUMENTS 6,917,762 B2 * 7/2005 Kim ..................... H03K 5/1504
                                                              341/100
8,634,090 B2 * 1/2014 Akamatsu .............. G03G 15/00
                                                               358/1.15

(Continued)

FOREIGN PATENT DOCUMENTS

JP       2010-114762       5/2010
JP       2011-019188       1/2011

OTHER PUBLICATIONS

Non-Final Rejection dated Oct. 14, 2015 in co-pending U.S. Appl. No. 14/600,339.*

(Continued)

*Primary Examiner* — Stephen Meier
*Assistant Examiner* — John P Zimmermann
(74) *Attorney, Agent, or Firm* — Oblon, McClelland, Maier & Neustadt, L.L.P.

(57) ABSTRACT

A communication apparatus includes a serializer configured to convert parallel data into serial data and output the serial data; and a deserializer configured to convert the serial data output from the serializer into parallel data and output the parallel data. The serializer is configured to add first data used for detecting unique data in the parallel data before the unique data, add second data used for detecting the unique (Continued)

data after the unique data, and add third data whose length is variable to each of the first data and the second data.

20 Claims, 6 Drawing Sheets (51) Int. Cl.
*H03M 5/14* (2006.01)
*G03G 15/00* (2006.01)

(56) References Cited

U.S. PATENT DOCUMENTS

| | | |
|---|---|---|
| 2002/0136570 A1* | 9/2002 | Yamanaka .............. H04N 1/047 399/301 |
| 2005/0111569 A1 | 5/2005 | Mikami et al. |
| 2007/0091165 A1 | 4/2007 | Shukuya |
| 2007/0133016 A1 | 6/2007 | Ohmiya |
| 2007/0140721 A1 | 6/2007 | Shinohara et al. |
| 2008/0069602 A1 | 3/2008 | Miyadera |
| 2008/0309951 A1 | 12/2008 | Kishi et al. |
| 2011/0043592 A1 | 2/2011 | Kinoshita et al. |
| 2011/0298883 A1 | 12/2011 | Ohyama |
| 2012/0056961 A1 | 3/2012 | Kinoshita et al. |
| 2012/0062681 A1 | 3/2012 | Miyadera et al. |
| 2012/0236381 A1 | 9/2012 | Oikawa |
| 2012/0300010 A1 | 11/2012 | Kawanabe et al. |
| 2013/0038885 A1 | 2/2013 | Higashiyama |
| 2014/0321527 A1 | 10/2014 | Inata et al. |

OTHER PUBLICATIONS

Notice of Allowance dated Apr. 11, 2016 in co-pending U.S. Appl. No. 14/600,339.

* cited by examiner

8B/10B SPECIAL CHARACTER SYMBOL CODES

| SYM-BOL NAME | DATA BYTE NAME | DATA BYTE VALUE (HEX) | 8B [HGF EDCBA] | 10B RD- [abcdei fghj] | 10B RD+ [abcdei fghj] | DESCRIPTION |
|---|---|---|---|---|---|---|
| COM | K28.5 | BC | 101 11100 | 001111 1010 | 110000 0101 | INTER-LINE DATA (DES SYNC SYMBOL) |
| STP1 | K23.7 | F7 | 111 10111 | 111010 1000 | 000101 0111 | LINE DATA START SYMBOL 1 |
| STP2 | K27.7 | FB | 111 11011 | 110110 1000 | 001001 0111 | LINE DATA START SYMBOL 2 |
| STP3 | K29.7 | FD | 111 11101 | 101110 1000 | 010001 0111 | LINE DATA START SYMBOL 3 |
| STP4 | K30.7 | FE | 111 11110 | 011110 1000 | 100001 0111 | LINE DATA START SYMBOL 4 |
| STP5 | K28.7 | FC | 111 11100 | 001111 1000 | 110000 0111 | LINE DATA START SYMBOL 5 |
| END1 | K28.0 | 1C | 000 11100 | 001111 0100 | 110000 1011 | LINE DATA END SYMBOL 1 |
| END2 | K28.1 | 3C | 001 11100 | 001111 1001 | 110000 0110 | LINE DATA END SYMBOL 2 |
| END3 | K28.2 | 5C | 010 11100 | 001111 0101 | 110000 1010 | LINE DATA END SYMBOL 3 |
| END4 | K28.3 | 7C | 011 11100 | 001111 0011 | 110000 1100 | LINE DATA END SYMBOL 4 |
| END5 | K28.4 | 9C | 100 11100 | 001111 0010 | 110000 1101 | LINE DATA END SYMBOL 5 |
| - | K28.6 | DC | 110 11100 | 001111 0110 | 110000 1001 | - |

COMMUNICATION APPARATUS, IMAGE FORMING APPARATUS, COMMUNICATION METHOD, AND COMPUTER-READABLE STORAGE MEDIUM

CROSS-REFERENCE TO RELATED APPLICATION

The present application is a continuation of U.S. application Ser. No. 14/600,339 filed Jan. 20, 2015, which claims priority to Japanese Patent Application No. 2014-018728 filed in Japan on Feb. 3, 2014. The entire contents of both of which are incorporated herein by reference.

BACKGROUND OF THE INVENTION

1. Field of the Invention

The present invention relates to a communication apparatus, an image forming apparatus, a communication method, and a computer-readable storage medium.

2. Description of the Related Art

In high-speed serial communication which uses 8B/10B conversion, for example, standard codes known as symbol codes can be transmitted in addition to converting and transmitting active data such as image data. The symbol codes include twelve types of codes in total, and a high-speed serial communication control technique has been known in which symbol codes are added before and after active data and if the symbol codes have not been received by a receiving side apparatus, then it is determined that a transmission error has occurred.

Japanese Laid-open Patent Publication No. 2011-19188, for example, discloses a configuration in which a serializer circuit inserts (adds) additional information for detecting image data in parallel data before and after the image data in parallel data, and a deserializer circuit detects each additional information inserted by the serializer circuit from within converted parallel data, extracts the image data from the parallel data based on each additional information if each such additional information has been detected, and detects an abnormal reception state if either one piece of the additional information has not been detected.

However, in a conventional high-speed serial communication control technique, if symbol codes have been added before and after the active data, the transfer time for the symbol codes becomes the order of a few nanoseconds during a high-speed communication exceeding 1 Gbps. In this case, if noise has occurred due to static electricity generated on a transmission path, the noise generation time becomes the order of a few microseconds. Accordingly, it becomes difficult to receive the symbol codes, and thus it is determined that a transmission error has occurred. A problem may arise such that if it has been determined that a transmission error has occurred, then it is necessary to discard image data for one line.

In the technique disclosed in Japanese Laid-open Patent Publication No. 2011-19188, for example, time for the additional information for detecting an abnormal state is short, and therefore this technique cannot solve the problem of low noise-resistant performance.

Therefore, there is a need to provide a communication apparatus, an image forming apparatus, a communication method, and a computer-readable storage medium capable of increasing noise-resistant performance in determining a transmission error.

SUMMARY OF THE INVENTION

It is an object of the present invention to at least partially solve the problems in the conventional technology.

According to an embodiment, there is provided a communication apparatus that includes a serializer configured to convert parallel data into serial data and output the serial data; and a deserializer configured to convert the serial data output from the serializer into parallel data and output the parallel data. The serializer is configured to add first data used for detecting unique data in the parallel data before the unique data, add second data used for detecting the unique data after the unique data, and add third data whose length is variable to each of the first data and the second data.

According to another embodiment, there is provided an image forming apparatus that includes the communication apparatus according to the above embodiment.

According to still another embodiment, there is provided a communication method executed by a communication apparatus that includes a serializer configured to convert parallel data into serial data and output the serial data; and a deserializer configured to convert the serial data output from the serializer into parallel data and output the parallel data. The method includes, in converting the parallel data into the serial data to output the serial data, adding first data used for detecting unique data in the parallel data before the unique data; adding second data used for detecting the unique data after the unique data; and adding third data whose length is variable to each of the first data and the second data.

According to still another embodiment, there is provided a non-transitory computer-readable storage medium with an executable program stored thereon and executed by a computer of a communication apparatus that includes a serializer configured to convert parallel data into serial data and output the serial data, and a deserializer configured to convert the serial data output from the serializer into parallel data and output the parallel data. The program instructs the computer to perform: in converting the parallel data into the serial data to output the serial data, adding first data used for detecting unique data in the parallel data before the unique data; adding second data used for detecting the unique data after the unique data; and adding third data whose length is variable to each of the first data and the second data.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinbelow, embodiments of a communication apparatus, an image forming apparatus, a communication method, and a computer-readable storage medium according to the present invention will be described with reference to attached drawings.

Figure 1:
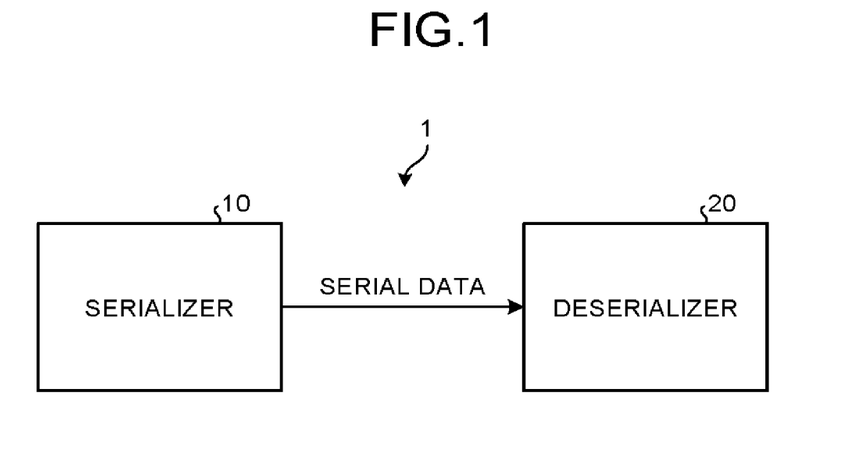
FIG. 1 is a schematic diagram illustrating a communication apparatus to which the present invention is applied.

FIG. 1 is a diagram schematically illustrating a communication apparatus 1 to which the present invention is applied. Referring to FIG. 1, the communication apparatus 1 includes a serializer 10 and a deserializer 20. The serializer 10, which will be described in detail below, converts parallel data into serial data and outputs the converted serial data. The deserializer 20 converts the serial data output from the serializer 10 into parallel data and outputs the converted parallel data.

Figure 2:
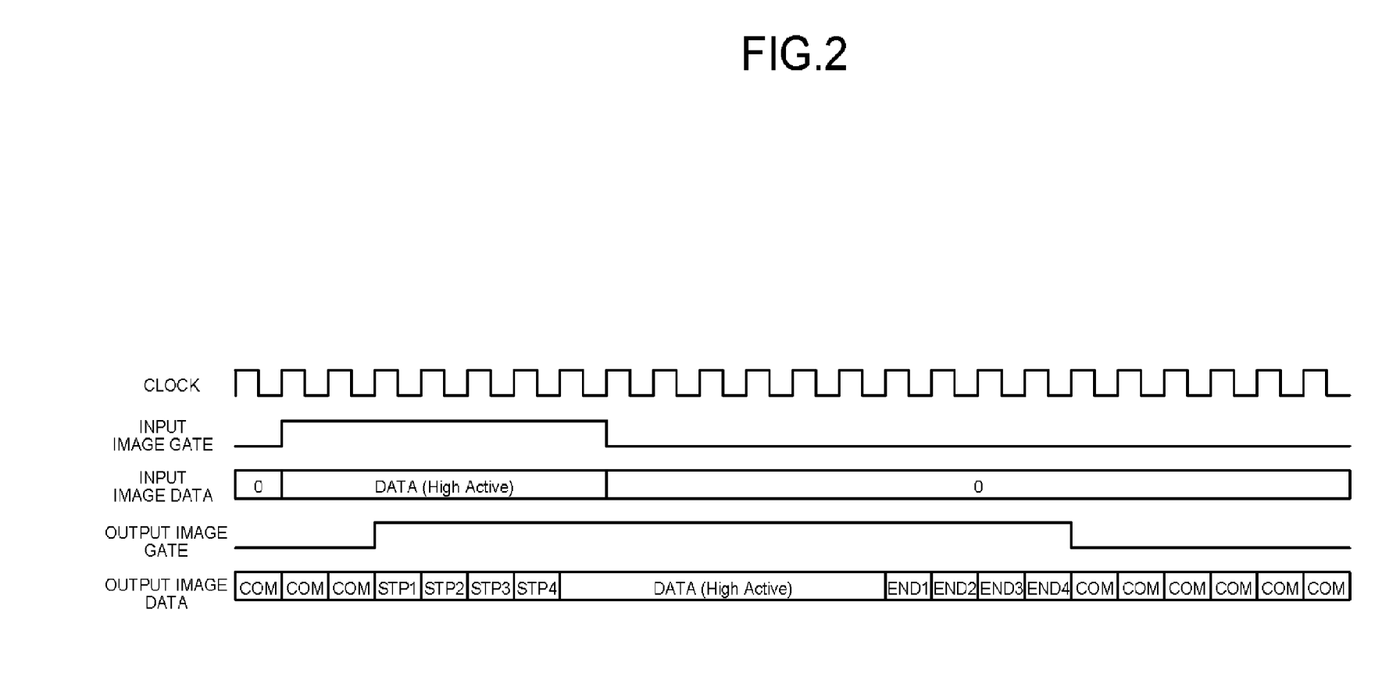
FIG. 2 is a diagram illustrating a concept for detecting an abnormal state used in a conventional high-speed serial communication by adding symbol codes.

To begin with, referring to FIG. 2, a concept for detecting an abnormal state used in conventional high-speed serial communication by adding symbol codes will be described. FIG. 2 is a diagram illustrating a concept for detecting an abnormal state used in conventional high-speed serial communication by adding symbol codes. In this example, a communication system which uses 8B/10B conversion will be described as an example of the high-speed serial communication. The 8B/10B conversion is a known technique employed in high-speed serial interface standards such as Serial Advanced Technology Attachment (Serial ATA), Peripheral Component Interconnect Express (PCI Express), and the like.

In addition, in this example, a case will be described in which image data is input to the serializer 10. In the following description, the image data input to the serializer 10 may also be referred to as input image data. In the example illustrated in FIG. 2, using a gate edge of an input image as a trigger, the serializer 10 adds symbol codes STP1 to STP4 used for detecting image data (for detecting a starting point) before the input image data and adds symbol codes END1 to END4 used for detecting the image data (for detecting an end point) after the input image data. In the following description, the symbol codes STP1 to STP4 will be collectively referred to as a "code STP" if they are not to be distinguished from one another, and the symbol codes END1 to END4 will be collectively referred to as a "code END" if they are not to be distinguished from one another. The code STP and the code END may be referred to as "first data" and "second data", respectively.

If an output image gate has been negated, then the serializer 10 transfers a symbol code COM used for recognizing that the data is data provided to an outside of the image data (the symbol code COM may be sometimes hereinafter simply referred to as a "code COM"). To describe this from a different point of view, the serializer 10 can be considered to generate transmission data by adding the code COM to the outside of the input image data to which additional information has been added. The serializer 10 encodes the 8-bit transmission data into 10-bit data on the basis of the 8B/10B encoding technique. In the example illustrated in FIG. 2, the encoded image data (output image data) becomes 10-bit high active data, which can be considered as unique data included in parallel data.

The serializer 10 converts the 10-bit data (parallel data) obtained by the encoding into serial data and outputs the converted serial data to the deserializer 20. The deserializer 20 deserializes the serial data input from the serializer 10 to convert the data into original 8-bit data. Note here that for the clock frequency used for transferring data, a frequency of about 100 MHz is used, and a maximum transfer rate in this case is 1,000 Mbps.

If two or more of the codes STP1 to STP4 and two or more of the codes END1 to END4 have been detected, then the deserializer 20 determines that the data has been normally received. Note that if the clock frequency of 100 MHz is used, the transfer time for the code STP is 40 ns, and the codes can be normally detected even if noise of about 10 ns has occurred.

Figure 3:
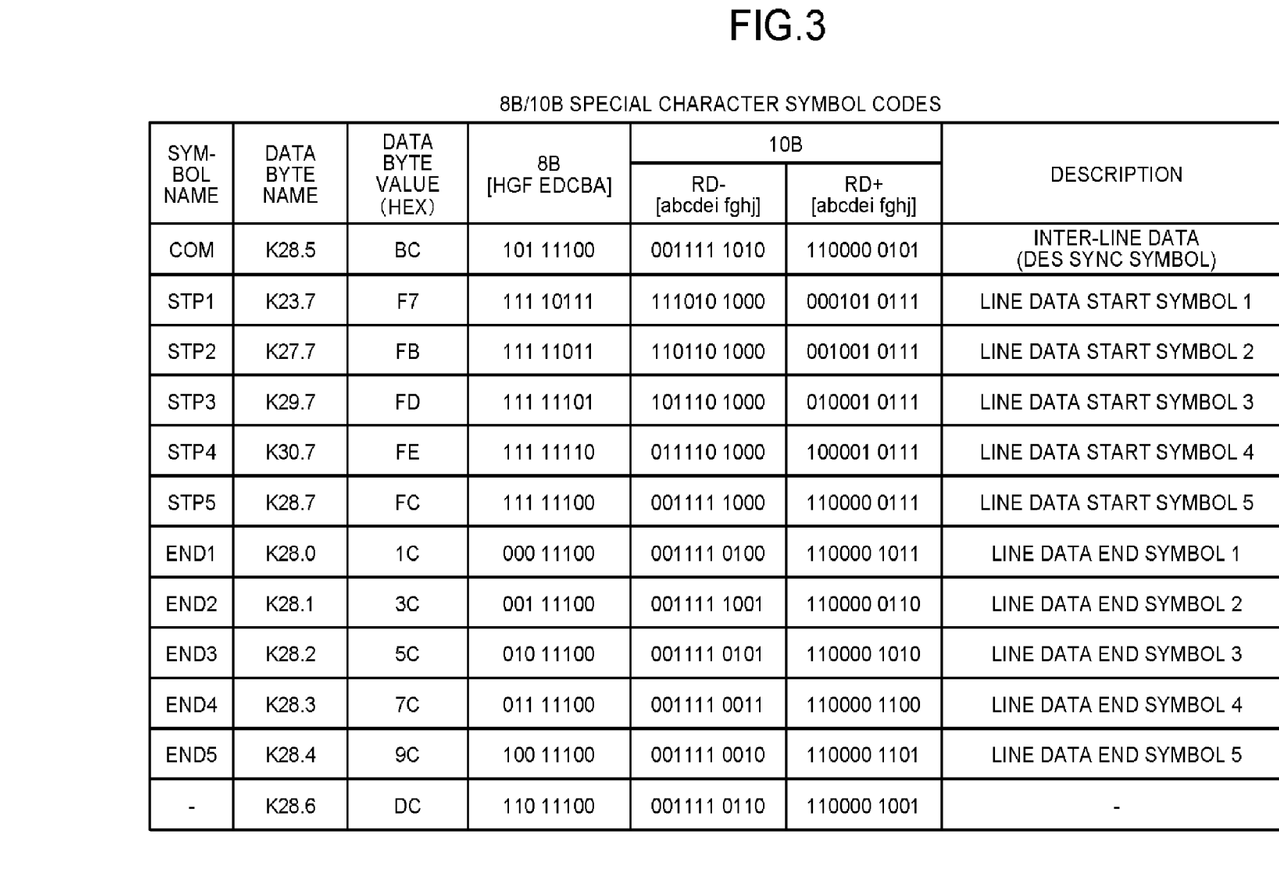
FIG. 3 is a diagram illustrating symbol codes used in 8B/10B conversion.

FIG. 3 is a diagram illustrating symbol codes used in the 8B/10B conversion. Twelve types of symbol codes are available, one of which is assigned as a code COM. The number of the codes STP/END can be increased up to five. In the example illustrated in FIG. 3, five out of the twelve types are assigned as the codes STP1 to STP5 and another five are assigned as the codes END1 to END5.

In FIG. 3, "RD−" and "RD+" each denote running disparity (RD). Because codes COM are serially generated, a code for alternately generating RD− and RD+ (any one of K28.5, K28.1, K28.2, K28.3, and K28.6) is preferable. This is because if a code for alternately generating RD− and RD+ is used, it becomes easy to determine whether the communication apparatus 1 has been normally operating in a stationary state.

Figure 4:
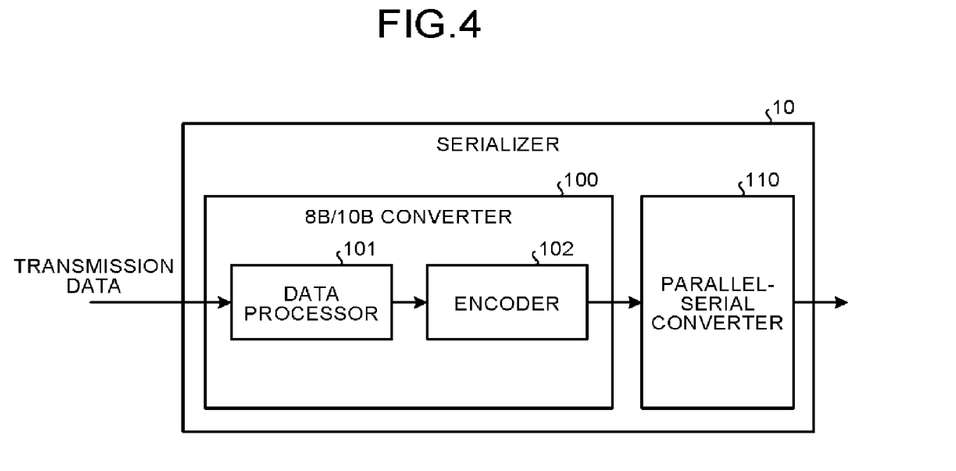
FIG. 4 is a diagram illustrating an example of functional configurations of a serializer.

Next, a specific configuration of the serializer 10 will be described with reference to FIG. 4. FIG. 4 is a diagram illustrating an example of functional configurations of the serializer 10. In FIG. 4, functions related to the present invention are primarily described for the purpose of illustration, however, the functions included in the serializer 10 are not limited to them. Referring to FIG. 4, the serializer 10 includes an 8B/10B converter 100 and a parallel-serial converter 110.

The 8B/10B converter 100 includes a data processor 101 and an encoder 102. In this example, image data is input to the data processor 101. The data processor 101 adds codes STP1 to STP4 before the input image data and codes END1 to END0 after the input image data. The data processor 101 adds a code COM to each of the codes STP and the codes END according to a setting value codelength_r, which is a setting value variably set by a central processing unit (CPU) provided outside the apparatus and stored in a memory (not illustrated), for example. This code COM may be referred to as "third data". The data processor 101 generates transmission data by adding COM data stationarily to an outside of the image data to which additional information (the codes STP, the codes END, and the code COM) has been added and outputs the generated transmission data to the encoder 102. This code COM may be referred to as "fourth data".

The encoder 102 converts the data input from the data processor 101 into 10-bit data by performing 8B/10B conversion and outputs the converted 10-bit data to the parallel-serial converter 110. More specifically, the image data (an example of the unique data included in parallel data) converted into 256 different codes D, and the codes STP, the codes END, and the code COM are converted into codes K for performing control and the converted codes K are output to the parallel-serial converter 110. The code K corresponding to the code STP may be also referred to as the first data, the code K corresponding to the code END may be also referred to as the second data, and the codes K corresponding to the codes COM may be also referred to as the third data and the fourth data. To put it briefly, the serializer 10 can be configured to include a function for adding the first data used in detecting unique data in parallel data before the unique data, for adding the second data used in detecting the unique data after the unique data, and for adding the third data of which the length can be variably set in relation to each of the first data and the second data.

The parallel-serial converter 110 serializes 10-bit data encoded by the 8B/10B converter 100 into 1-bit data and outputs the converted 1-bit data.

Figure 5:
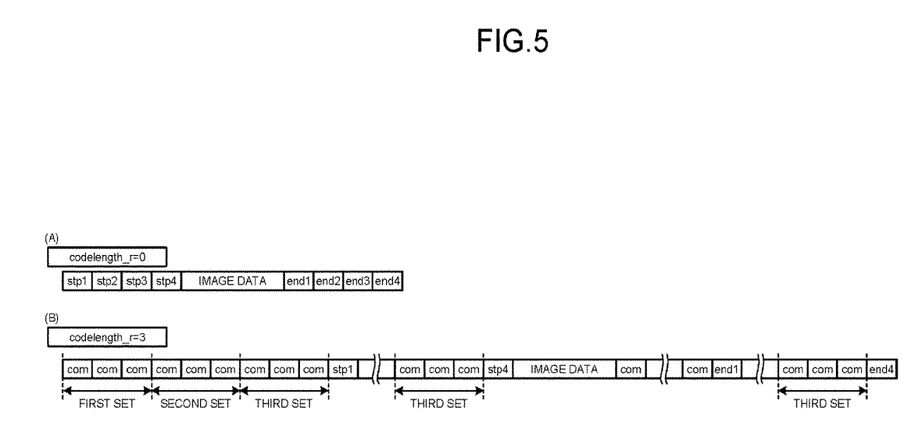
FIG. 5 is a diagram illustrating variable-length control of symbol codes.

FIG. 5 illustrates variable length control of symbol codes according to the present embodiment. In this example, the number of codes STP/END is four (codes STP1 to STP4 and codes END1 to END4), respectively. However, the number of the codes STP/END is not limited to four and can be increased up to five. The serializer 10 switches a protocol for the codes STP/END codes according to a setting value of codelength_r.

Referring to (A) in FIG. 5, if codelength_r=0, then a normal mode (a transmission mode equivalent to the mode illustrated in FIG. 2) is set. On the other hand, if codelength_r=1 to 15, then the serializer 10 (the data processor 101) adds (inserts) the codes COM into the codes STP and the codes END by the number set according to the setting value of codelength_r. In this example, for a unit of insertion of the codes COM to be inserted into the codes STP/END, three codes COM are used as one set and the number of the codes COM is determined by 1 set×codelength_r. Note that the number of the codes COM is not limited to this, and the number of codes COM included in one set can be variably set according to the clock rate and assumed noise generation time. The number of the codes COM in one set varies according to the setting value of codenum_r. For example, if codenum_r=3, the number of the codes COM in one set is three. Because it is preferable to set two or more for the number of codes COM in one set, a value of 2 or greater is set. To put it briefly, one insertion unit of the data to be added into the code STP and the code END (the code COM in this example) may be constituted by N (N≥2)×M (M is a natural number) pieces of continuous data. Here, "N" denotes the setting value of codenum_r and "M" denotes the setting value of codelength_r. The value of M and the number to be set for the insertion unit are variably set by a CPU provided outside of the apparatus. Alternatively, a code different from a code COM (for example, K28.6 or the like) can be used as the code to be variably inserted into the codes STP/END to distinguish the code to be variably inserted into the codes STP/END from the code to be stationarily inserted to the outside of the image data (the code COM).

Referring to (B) in FIG. 5, suppose a case where codelength_r=3. In this case, supposing that the rate of transfer from the serializer 10 to the deserializer 20 is 1 Gbps, then the total length of codes COM and STP can be determined as follows: (3 codes COM×3 sets+1 code STP)×4 codes STP×10 ns=400 ns. In this example, noise generated on the transmission line due to static electricity, etc. is 100 ns order. Noise can be sufficiently prevented because the setting value of codelength_r=15 (the maximum value) and the increase of the length of the code COM is 3 codes COM×15 sets×4×10 ns=1,800 ns.

For detection of the codes STP/END by the deserializer 20, the deserializer 20 determines that the codes have been normally detected if two symbols out of four (or two symbols out of five) have been detected for the codes STP and END, respectively. Because the deserializer 20 recognizes that data provided to the outside of image data has been received upon detection of the code COM, the length between the codes STP and the codes END can be increased as well as detection of noise by using the code COM alone can be implemented by transmitting multiple codes COM as a set. If one set is constituted by three codes COM, for example, and if it is detected that a specific symbol (either one of the codes STP1 to STP4 and the codes END1 to END4) has been changed into one symbol code COM and if two subsequent codes COM have been detected, the deserializer 20 can determine that the codes STP/END have been normally detected.

If the codes STP/END have been successfully detected, the deserializer 20 recognizes that the data has been normally transferred. Even if the deserializer 20 has failed to detect the codes STP/END, the deserializer 20 recognizes that the data has been normally transferred if the code COM (or K28.6) has been successfully detected.

If the deserializer 20 has failed to detect no codes STP/END or code COM either, then the deserializer 20 recognizes that an abnormality has occurred for the data transfer (that a transmission error has occurred). In this case, the deserializer 20 notifies that an abnormality has occurred for the data transfer. In addition, the deserializer 20 can also discard the data for one line.

As described above, in the detection of abnormality according to the present embodiment, a code COM is added (inserted) into the codes STP/END to increase the spacing among the codes STP/END, and thus it is enabled to increase the probability of detecting the codes STP/END if noise has occurred. Accordingly, the types of the symbol codes would not increase, and thus the noise-resistant performance is improved while the size of necessary circuits in adding the functions is reduced. In addition, by using three codes COM to be inserted into the codes STP/END as one set, detection of an abnormality by using the code COM alone is enabled.

Moreover, in order to verify whether image data has been normally transferred, a gate signal which coincides with the timing of the image data can be generated and externally monitored. Further, in order to verify that the codes have been normally added, a gate signal which coincides with the timing of the codes STP+image data+the codes END can be generated and externally monitored.

It is easy to add the codes after the image data, and two different methods can be used for adding the codes before the image data. In one method, a block which adds the codes receives image data and delays the data by using a flip-flop (FF) circuit or a static random access memory (SRAM) for time equivalent to the length of the code. To put it briefly, the serializer 10 can add third data (the code COM, for example) before the unique data by delaying the unique data. This method has an advantage such that the addition of the codes can be easily performed because the delayed data can be transmitted after the codes have been added in this method.

In the other method, on the basis of a common synchronism signal, a block which transmits image data delays the transmission of data for time equivalent to the length of the codes and a block which adds the codes starts the addition of the codes before receiving the image data. To put it briefly, the serializer 10 can also start the addition of the third data before receiving the unique data. This method has an advantage such that the addition of the codes can be implemented at low costs because no delay circuit is required for the block which adds the codes in this method.

As described above, a high-speed serial communication system which improves the noise-resistant performance can be implemented by changing one setting value of codelength_r only, by also simply controlling the setting value within a range of the values of 1 to 15, and by using a low-cost circuit which uses existing symbol codes. If a higher noise-resistant performance is to be pursued, the system can be alternatively configured so that the number of symbols in the codes STP/END and the number of sets of the codes COM included in one set are externally set.

Figure 6:
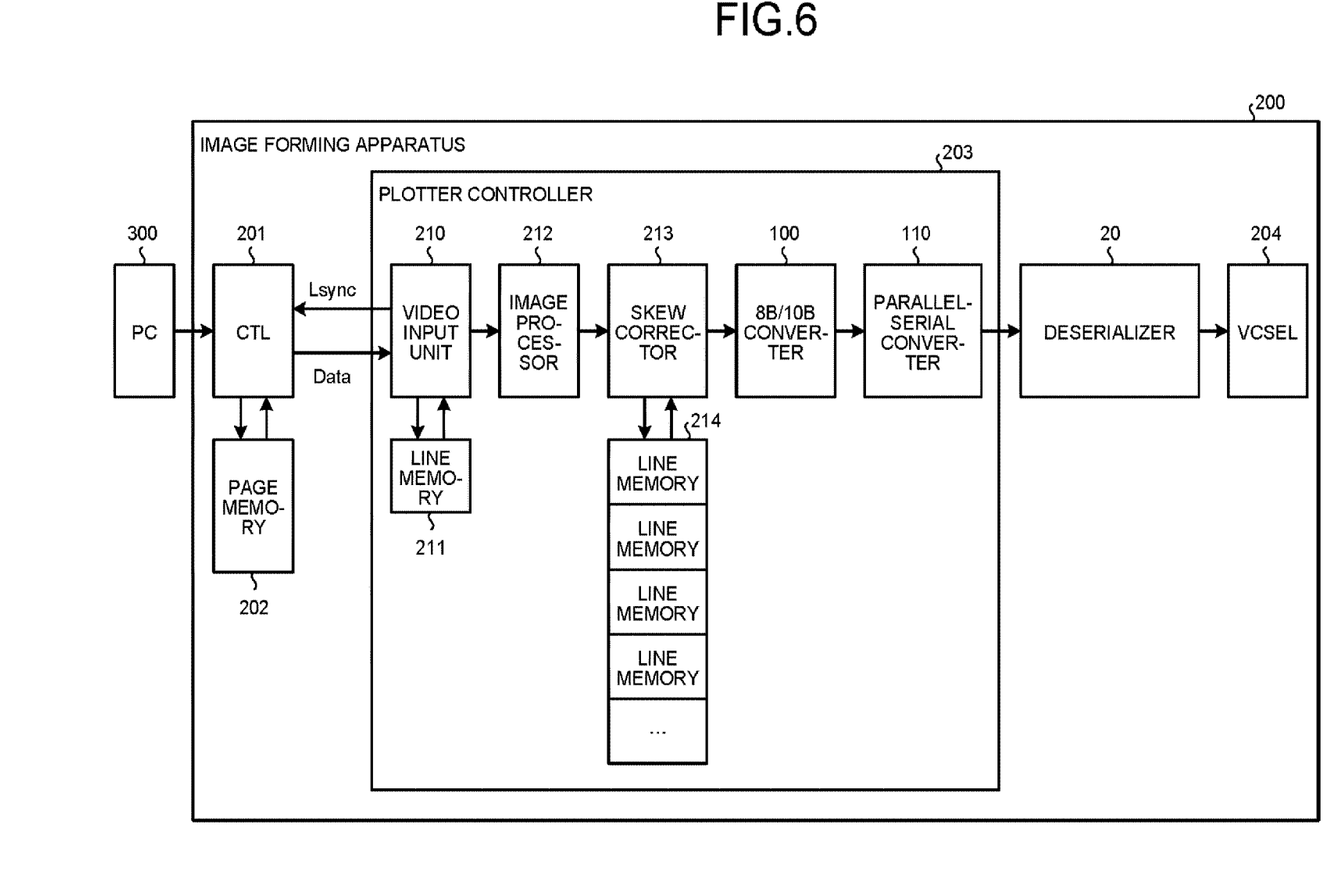
FIG. 6 is a diagram illustrating an example of configurations of an image forming apparatus.

The communication apparatus 1 described above can be installed to various types of electronic apparatuses. For example, the communication apparatus 1 can be installed to an image forming apparatuses, such as a multifunction peripheral (MFP). FIG. 6 is a diagram illustrating an example of a configuration of an image forming apparatus 200 to which the communication apparatus 1 is installed. In the example illustrated in FIG. 6, the image forming apparatus 200 includes a controller (CTL) 201, a page memory 202, a plotter controller 203, a deserializer 20, and a vertical cavity surface emitting laser (VCSEL) 204. The plotter controller 203 includes a video input unit 210, a line memory 211, an image processor 212, a skew corrector 213, a line memory 214, an 8B/10B converter 100, and a parallel-serial converter 110.

For the high-speed serial communication implemented by this example, a specification is assumed in which data of an electrophotographic image is transferred to a driver of a light source used in a high-speed machine such as the VCSEL 204. When a printing operation is instructed from a personal computer (PC) 300, the image data is transferred to the CTL 201 via a printer driver installed on the PC 300. The CTL 201 converts the image data into bitmap data and transfers the converted bitmap data to the plotter controller 203 as emission data to be actually printed.

A line synchronism signal (LSYNC) (a pulsed synchronization signal which indicates a leading edge of a line) is output from the plotter controller 203 (the video input unit 210) to the CTL 201. The CTL 201 transfers the data to the plotter controller 203 in synchronization with the timing of output of the signal LSYNC. The method for performing this transfer includes an image forming method capable of processing different formats for a plurality of types of color plates and another image forming method in which a format common to color plates only is processed.

In some cases, the operation clock frequency of the plotter controller 203 may be different from that of the CTL 201. In such cases, the video input unit 210 performs frequency conversion by temporarily storing the image data in the line memory 211 and reading the data on the basis of the operation clock of the plotter controller 203. The image data of which the clock frequency has been converted by the video input unit 210 is supplied to the image processor 212. The image processor 212 performs predetermined image processing such as internal pattern processing and trimming on the supplied image data and outputs the processed image data. If the image processor 212 is provided with a line memory, then image processing which requires a line memory, such as jaggy correction, can be performed.

The image data output from the image processor 212 is then supplied to the skew corrector 213. The skew corrector 213 stores the supplied image data on a plurality of line memories 214 for correcting skewing. The skew corrector 213 performs correction of skewing by switching the line memory 214 to be read according to the location of the image. The frequency conversion can also be performed by writing the data on a skew correction memory and reading the data therefrom.

Note that in performing the correction of skewing, the skew corrector 213 can convert the data after the correction of skewing into high density data having a resolution in a sub-scanning direction higher than the resolution at the time of writing of the data by N times by setting a line cycle which is 1/N (N is a natural number) of the line cycle at the time of writing of the data as the line cycle after reading of the data and by reading the data from one line memory 214 N times. This processing is referred to as "resolution doubling". The image data output from the skew corrector 213 is transferred to the above-described 8B/10B converter 100. The 8B/10B converter 100 performs 8B/10B conversion and the addition of the symbol codes. After having been converted into 10-bit data by the 8B/10B conversion, the data is converted into serial data by the above-described parallel-serial converter 110, then the converted serial data is output to the deserializer 20 provided outside the plotter controller 203 to be converted again into original 8-bit data there. Then the VCSEL 204 emits light on the basis of the reconverted 8-bit data.

Note that the light source is not limited to the VCSEL. The light source may be configured so as to control emission of light from a laser diode (LD), a multiple LD, an LD array, a line head (a light emitting diode array (LEDA) or an organic electroluminescent (EL) device), and the like. To put it briefly, the above-described serializer 10 (the 8B/10B converter 100, the parallel-serial converter 110) may also be configured to be connected with a driver of a surface emitting laser, or with a driver of a multi-laser, or with a driver of a line head.

For the hardware configuration of the above-described communication apparatus 1, the communication apparatus 1 is constituted by a computer system which includes a CPU, storage devices such as a read-only memory (ROM) or a random access memory (RAM), and a communication interface (I/F) for communication with MFPs and the like, and the functions of the components (the components such as the 8B/10B converter 100) of the above-described communication apparatus 1 are implemented by the CPU by executing a program stored in the storage device. The present invention is not limited to this, and at least a part of the functions of the components of the above-described communication apparatus 1 may also be implemented by a dedicated hardware circuit (a circuit such as a semiconductor integrated circuit (IC)), for example.

In addition, the program to be executed by the communication apparatus 1 according to the above-described embodiment may be configured to be recorded in a file of an installable format or of an executable format in a computer-readable storage medium such as a compact disc-read only memory (CD-ROM), a flexible disk (FD), a compact disc-recordable (CD-R), a digital versatile disk (DVD), and a universal serial bus (USB) and provided, or may also be configured to be provided or supplied via a network such as the Internet. In addition, the program to be executed by the communication apparatus 1 according to the above-described embodiment may be configured to be provided as various programs previously installed in a ROM and the like.

According to the embodiment described above, noise-resistant performance can be improved in determining a transmission error.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A communication apparatus comprising:
    a serializer configured to convert parallel data into serial data and output the serial data; and
    a deserializer configured to convert the serial data output from the serializer into parallel data and output the parallel data,
    wherein the serializer is configured to add a plurality of pieces of first data used for detecting unique data in the parallel data before the unique data, add a plurality of pieces of second data used for detecting the unique data after the unique data, and to interleave a plurality of pieces of third data whose length is variable in between the plurality of pieces of first data and in between the plurality of pieces of second data.

2. The communication apparatus according to claim 1, wherein the unique data is image data.

3. The communication apparatus according to claim 1, wherein the parallel data is 10-bit data generated by 8B/10B conversion.

4. The communication apparatus according to claim 1, wherein the serializer is configured to stationarily add fourth data to an outside of the parallel data.

5. The communication apparatus according to claim 4, wherein the first data, the second data, the third data, and the fourth data are each any one of a plurality of types of symbol codes for the 8B/10B conversion.

6. The communication apparatus according to claim 5, wherein the third data is any one of K28.5, K28.1, K28.2, K28.3, and K28.6.

7. The communication apparatus according to claim 5, wherein the fourth data is any one of K28.5, K28.1, K28.2, K28.3, and K28.6.

8. The communication apparatus according to claim 5, wherein the third data is a symbol code equivalent to the fourth data.

9. The communication apparatus according to claim 1, wherein one insertion unit of the third data is made up of N×M pieces of continuous data, where N is equal to or more than 2 and M is a natural number.

10. The communication apparatus according to claim 9, wherein a value of the number M is variably set.

11. The communication apparatus according to claim 1, wherein the serializer is configured to delay the unique data to add the third data before the unique data.

12. The communication apparatus according to claim 1, wherein the serializer is configured to start the addition of the third data before receiving the unique data.

13. The communication apparatus according to claim 1, wherein the deserializer is configured to perform detection of the first data and the second data from within the parallel data, extract the unique data when the first data and the second data are detected, and detect an abnormal reception state when neither the first data nor the second data is detected.

14. An image forming apparatus comprising the communication apparatus according to claim 1.

15. The image forming apparatus according to claim 14, wherein the serializer is connected to a driver for a surface emitting laser.

16. The image forming apparatus according to claim 15, wherein the serializer is connected to a driver for a multi-laser.

17. The image forming apparatus according to claim 15, wherein the serializer is connected to a driver for a line head.

18. A communication method executed by a communication apparatus that includes a serializer configured to convert parallel data into serial data and output the serial data; and a deserializer configured to convert the serial data output from the serializer into parallel data and output the parallel data, the method comprising:
  in converting the parallel data into the serial data to output the serial data,
  adding a plurality of pieces of first data used for detecting unique data in the parallel data before the unique data;
  adding a plurality of pieces of second data used for detecting the unique data after the unique data; and
  interleaving a plurality of pieces of third data whose length is variable in between the plurality of pieces of first data and in between the plurality of pieces of second data.

19. A non-transitory computer-readable storage medium with an executable program stored thereon and executed by a computer of a communication apparatus that includes a serializer configured to convert parallel data into serial data and output the serial data, and a deserializer configured to convert the serial data output from the serializer into parallel data and output the parallel data, wherein the program instructs the computer to perform:
  in converting the parallel data into the serial data to output the serial data,
  adding a plurality of pieces of first data used for detecting unique data in the parallel data before the unique data;
  adding a plurality of pieces of second data used for detecting the unique data after the unique data; and
  interleaving a plurality of pieces of third data whose length is variable in between the plurality of pieces of first data and in between the plurality of pieces of second data.

20. The communication apparatus according to claim 1, wherein the plurality of pieces of first data are not contiguous after interleaving with the plurality of pieced of third data, and the plurality of pieces of second data are not contiguous after interleaving with the plurality of pieces of third data.

* * * * *